(12) United States Patent
Cordero et al.

(10) Patent No.: US 9,063,902 B2
(45) Date of Patent: Jun. 23, 2015

(54) IMPLEMENTING ENHANCED HARDWARE ASSISTED DRAM REPAIR USING A DATA REGISTER FOR DRAM REPAIR SELECTIVELY PROVIDED IN A DRAM MODULE

(75) Inventors: Edgar R. Cordero, Round Rock, TX (US); Joab D. Henderson, Austin, TX (US); Divya Kumar, Austin, TX (US); Jeffrey A. Sabrowski, Leander, TX (US); Anuwat Saetow, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 13/343,938

(22) Filed: Jan. 5, 2012

(65) Prior Publication Data

US 2013/0179724 A1 Jul. 11, 2013

(51) Int. Cl.
*G06F 11/18* (2006.01)
*G06F 11/16* (2006.01)
*G11C 29/00* (2006.01)
*G06F 11/10* (2006.01)
*G06F 11/20* (2006.01)
*G06F 11/14* (2006.01)

(52) U.S. Cl.
CPC ............ *G06F 11/1666* (2013.01); *G11C 29/76* (2013.01); *G06F 11/20* (2013.01); *G06F 11/141* (2013.01); *G06F 11/1048* (2013.01)

(58) Field of Classification Search
CPC ... G06F 11/1666; G06F 11/18; G06F 11/186; G11C 29/70; G11C 29/76; G11C 29/765
USPC ......................... 714/6.12, 6.13, 6.2
See application file for complete search history.

(56) References Cited

U.S. PATENT DOCUMENTS

| | | | |
|---|---|---|---|
| 4,654,847 A * | 3/1987 | Dutton | 714/6.1 |
| 4,942,556 A * | 7/1990 | Sasaki et al. | 365/200 |
| 5,991,517 A | 11/1999 | Harari et al. | |
| 6,243,306 B1 * | 6/2001 | Kirihata | 365/200 |
| 6,438,672 B1 * | 8/2002 | Fischer et al. | 711/210 |
| 6,467,048 B1 * | 10/2002 | Olarig et al. | 714/6.32 |
| 6,671,214 B2 | 12/2003 | Abedifard et al. | |
| 7,225,303 B2 | 5/2007 | Choi | |
| 7,379,361 B2 | 5/2008 | Co et al. | |
| 7,518,918 B2 | 4/2009 | Gorman | |
| 7,770,077 B2 | 8/2010 | Arimilli et al. | |
| 7,984,329 B2 * | 7/2011 | Lastras-Montano et al. | 714/6.13 |

(Continued)

OTHER PUBLICATIONS

B. Ganesh et al., "Fully-Buffered DIMM Memory Architectures: Understanding Mechanisms, Overheads and Scaling," IEEE 13th International Symposium on High Performance Computer Architecture, HPCA, Feb. 10-14, 2007, pp. 109-120.

(Continued)

*Primary Examiner* — Joseph Schell
(74) *Attorney, Agent, or Firm* — Joan Pennington

(57) ABSTRACT

A method, system and computer program product are provided for implementing hardware assisted Dynamic Random Access Memory (DRAM) repair in a computer system that supports ECC. A data register providing DRAM repair is selectively provided in one of the Dynamic Random Access Memory (DRAM), a memory controller, or a memory buffer coupled between the DRAM and the memory controller. The data register is configured to map to any address. Responsive to the configured address being detected, the reads to or the writes from the configured address are routed to the data register.

16 Claims, 7 Drawing Sheets

(56) References Cited

U.S. PATENT DOCUMENTS

| | | | | |
|---|---|---|---|---|
| 2006/0140027 | A1* | 6/2006 | Tominaga | 365/200 |
| 2009/0193290 | A1* | 7/2009 | Arimilli et al. | 714/7 |
| 2012/0266041 | A1* | 10/2012 | Wang et al. | 714/752 |
| 2012/0311248 | A1* | 12/2012 | Goodman | 711/105 |
| 2014/0250348 | A1* | 9/2014 | Harari et al. | 714/773 |

OTHER PUBLICATIONS

J. Lin et al., "DRAM-Level Prefetching for Fully-Buffered DIMM: Design, Performance and Power Saving" IEEE International Symposium on Performance Analysis of Systems & Software, ISPASS, Apr. 25-27, 2007, pp. 94-104.

\* cited by examiner

IMPLEMENTING ENHANCED HARDWARE ASSISTED DRAM REPAIR USING A DATA REGISTER FOR DRAM REPAIR SELECTIVELY PROVIDED IN A DRAM MODULE

FIELD OF THE INVENTION

The present invention relates generally to the data processing field, and more particularly, relates to a method, system and computer program product for implementing hardware assisted Dynamic Random Access Memory (DRAM) repair in a computer system.

DESCRIPTION OF THE RELATED ART

Modern computer systems typically are configured with a large amount of memory in order to provide data and instructions to one or more processors in the computer systems. Main memory of the computer system is typically large, often many GB (gigabytes) and is typically implemented in DRAM.

Bad memory cells are a common failure mechanism in system DRAM. Redundancy has been used for repair of a memory system of memory modules, such as Dual In-Line Memory Modules (DIMMs). Conventional redundancy arrangements can dramatically increase the overall cost of the memory subsystem. This redundancy is usually in the form of extra DRAM modules or DIMMs, and can often be too much for a majority of failures.

A need exists for an effective mechanism for implementing repair or redundancy enabling the memory system to recover from single address or small range of address fails. It is desirable that such mechanism is provided without substantially increasing cost or system overhead.

SUMMARY OF THE INVENTION

Principal aspects of the present invention are to provide a method, system and computer program product for implementing hardware assisted Dynamic Random Access Memory (DRAM) repair in a computer system that supports error correcting code (ECC). Other important aspects of the present invention are to provide such method, system and computer program product substantially without negative effects and that overcome many of the disadvantages of prior art arrangements.

In brief, a method, system and computer program product are provided for implementing hardware assisted Dynamic Random Access Memory (DRAM) repair in a computer system with ECC. A data register providing DRAM repair is selectively provided in one of the Dynamic Random Access Memory (DRAM), a memory controller, or a memory buffer coupled between the DRAM and the memory controller. The data register is configured to map to any address. Responsive to the configured address being detected, the reads to or the writes from the configured address are routed to the data register.

In accordance with features of the invention, the data register includes an alternative memory array. With the data register is provided in the DRAM, memory buffer or memory controller latencies are preserved, so that use of the AMA is substantially transparent to the system. An additional advantage is that by reducing the system overhead and cost normally associated with current redundancy implementations, the negative impact to the system is minimized.

In accordance with features of the invention, the data register is used as a replacement of the failing address. In this case, the writes and reads go to or come from the register directly. A second way to use the register is to send all writes to both the DRAM and the data register. In this case, the register is used as a backup instead of replacement. Reads are sent to the DRAM and passes through if no error is detected. Should an error occur, the contents of the register are used, replacing the failing data from the DRAM.

In accordance with features of the invention, redundant addresses in the DRAM optionally are used. DRAM commonly has predefined redundant addresses in DRAM arrays. The predefined redundant addresses are made available to the system and are invoked as needed and mapped to failing addresses. Another source for spare addresses is to allocate an address range in the normally available address space. The range of addresses is allocated to be used to replace failing addresses.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product are provided for implementing hardware assisted Dynamic Random Access Memory (DRAM) repair in a computer system with ECC.

In accordance with features of the invention, the method, system and computer program product provide repair or redundancy enabling the memory system to recover from single address or small range of address fails, and without substantially increasing cost or system overhead.

Figure 1:
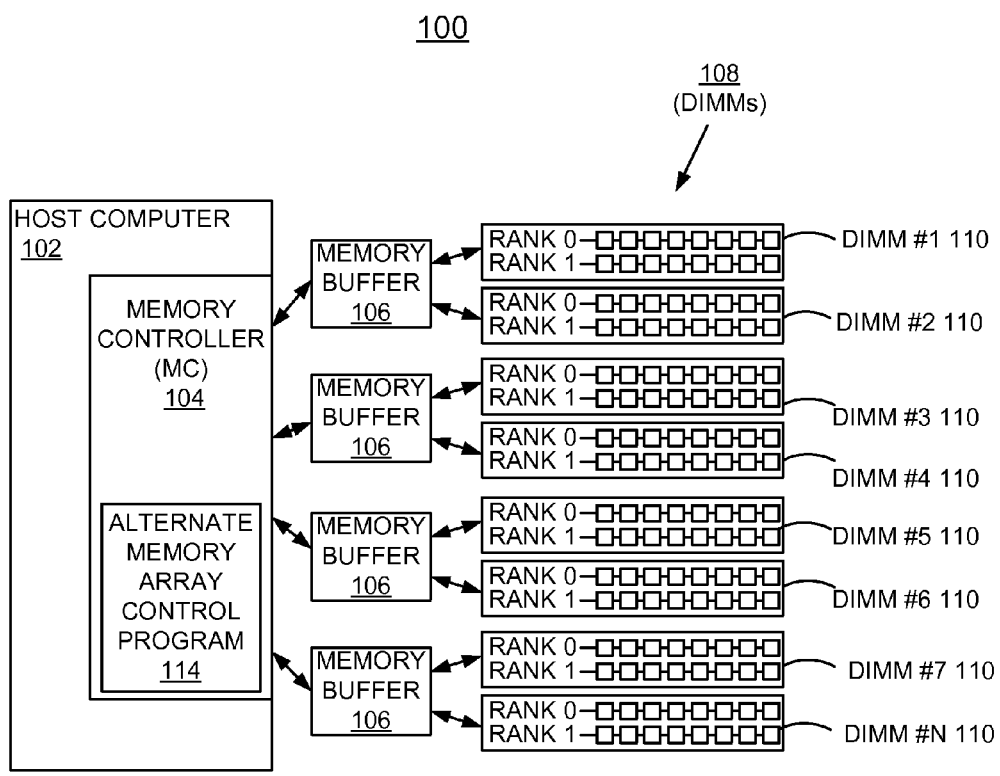
FIG. 1 is a block diagram representation illustrating an example system for implementing hardware assisted Dynamic Random Access Memory (DRAM) repair in accordance with the preferred embodiment.

Having reference now to the drawings, in FIG. 1, there is shown an example computer system generally designated by the reference character 100 for implementing hardware assisted Dynamic Random Access Memory (DRAM) repair in accordance with the preferred embodiment.

Computer system 100 includes a host computer 102 including a memory controller 104 coupled by at least one or a plurality of memory buffers 106 or memory buffer chip 106 to a system dynamic random access memory (DRAM) 108, such as a plurality of Dual In-Line Memory Modules (DIMMs) 1-N, 110.

Computer system 100 includes an alternate memory array control program 114 of the preferred embodiment. Memory controller 104 is suitably programmed by the alternate memory array control program 114 to execute the flow charts of FIGS. 2 and 3 of the preferred embodiment. Computer system 100 implements enhanced hardware assisted Dynamic Random Access Memory (DRAM) repair in accordance with the preferred embodiments.

Computer system 100 implements redundancy, greatly improving the ability of the system to recover from single address or small range of address fails. An alternate memory array 402, as illustrated and described with respect to FIGS. 2-6, stores instances of redundancy, for example, and is provided in a selected one of DRAM 108, memory buffer 106, or memory controller (MC) 104. While implementation of the AMA 402 at the MC 104 and buffer 106 does not add to the latency, implementation at the DRAM 108 can increase latency slightly. At the DRAM 108, extra wiring is provided to relay the ECC data as well as a predefined command or MRS command to signal a switch to a spare DRAM location.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

Figure 2:
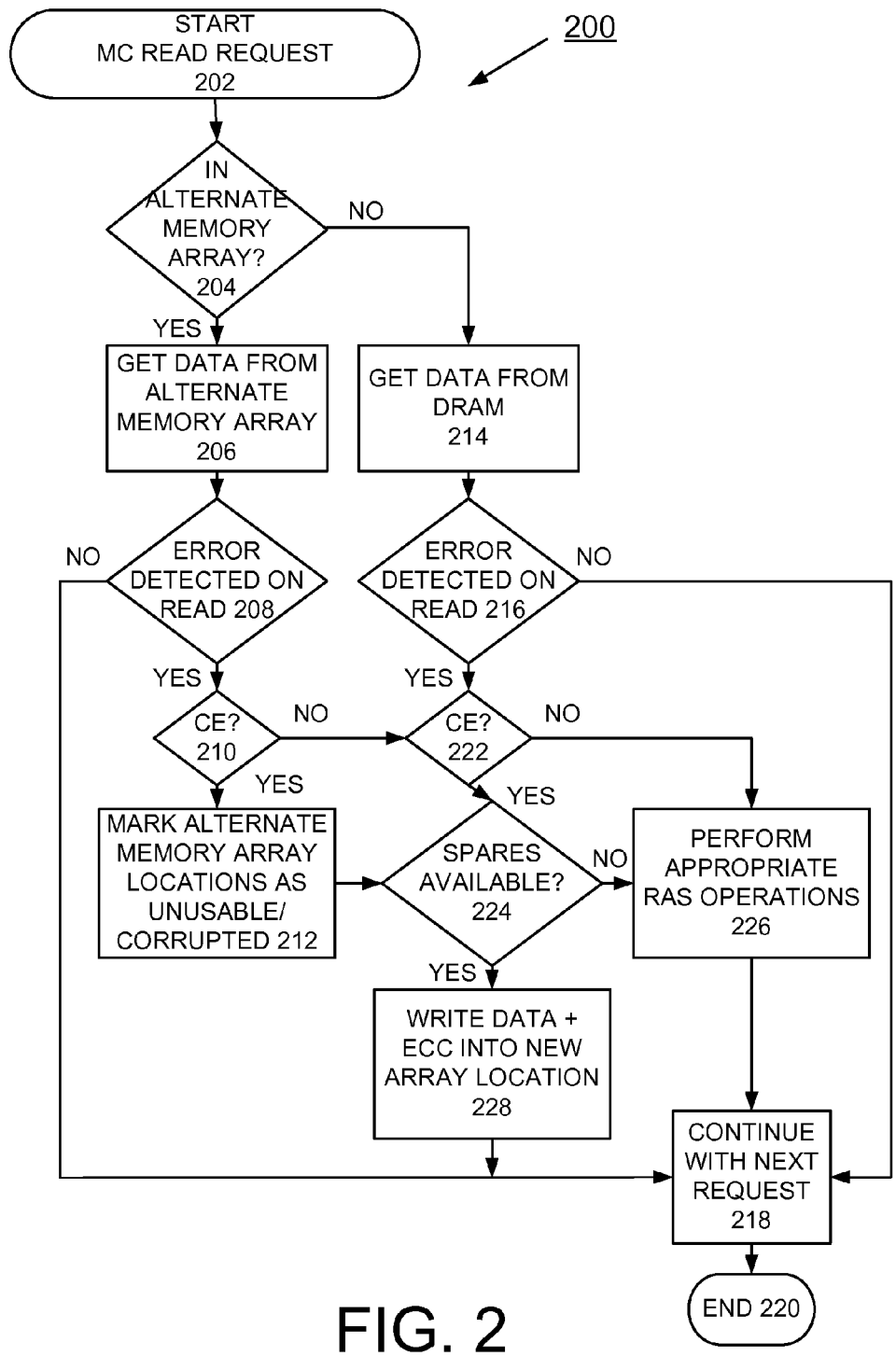
FIG. 2 is a high level flow chart illustrating exemplary operations of the example system of FIG. 1 for implementing hardware assisted Dynamic Random Access Memory (DRAM) repair in accordance with the preferred embodiment.
Figure 3:
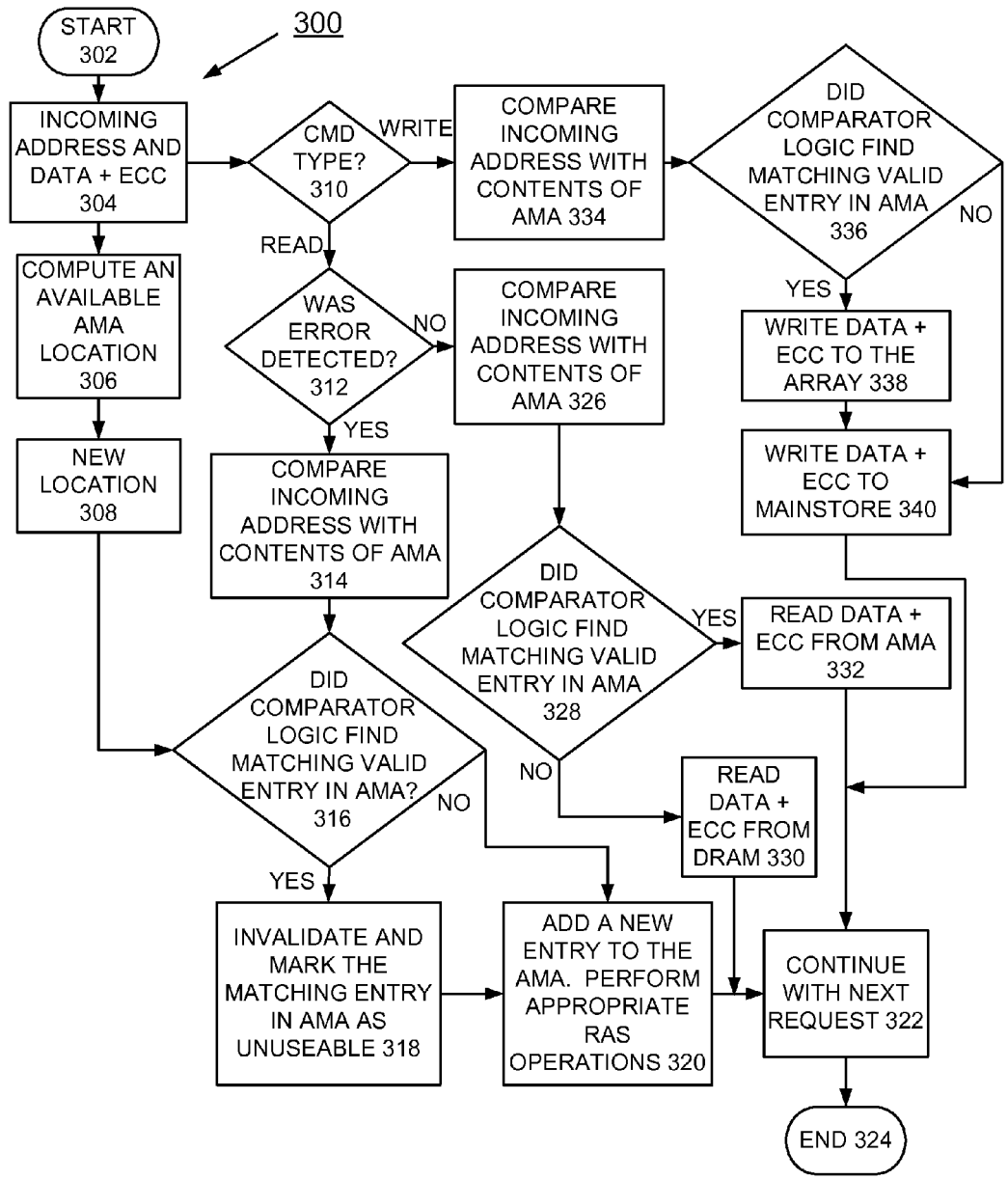
FIG. 3 is a high level flow chart illustrating exemplary alternate memory array operations of the example system of FIG. 1 for implementing hardware assisted Dynamic Random Access Memory (DRAM) repair in accordance with the preferred embodiment.

Referring to FIGS. 2 and 3, there are shown respective flow charts generally designated by the reference characters 200, 300 illustrating exemplary operations of the example system 100 for implementing hardware assisted Dynamic Random Access Memory (DRAM) repair in accordance with preferred embodiments of the invention.

In FIG. 2, exemplary AMA operations start as indicated at a block 202. As indicated at a block 204, an incoming address, data and ECC are received as indicated at a block 204. An available AMA location is computed as indicated at a block 206. A new location is identified as indicated at a block 208. Responsive to an incoming address, data and ECC received at block 204, checking for a command type is performed as indicated at a decision block 210. When a read command is identified, checking if an error was detected as indicated at a decision block 212. When an error was detected, the incoming address is compared with contents of AMA as indicated at a block 214. Checking whether comparator logic found a matching valid entry in the AMA as indicated at a decision block 216. When the comparator logic found a matching valid entry in the AMA, the matching entry in the AMA is invalidated and marked as unusable as indicated at a block 218. A new entry is added to the AMA, and RAS operations are performed as indicated at a block 220. Operations continue with the next request at block 222. Operations end as indicated at a block 224.

When an error was not detected at decision block 212, the incoming address is compared with contents of AMA as indicated at a block 226. Checking whether comparator logic found a matching valid entry in the AMA as indicated at a decision block 228. When the comparator logic did not find a matching valid entry in the AMA, data and ECC are read from the DRAM as indicated at a block 230. When the comparator logic found a matching valid entry in the AMA, data and ECC are read from the AMA as indicated at a block 232. Operations continue with the next request at block 222. Operations end as indicated at a block 224.

When a write command is identified at decision block 210, the incoming address is compared with contents of the AMA as indicated at a block 234. Checking whether the comparator logic finds a matching valid entry in the AMA is performed as indicated at a decision block 236. When the comparator logic found a matching valid entry in the AMA, data and ECC are written the AMA as indicated at a block 238. When the comparator logic did not find a matching valid entry in the AMA, data and ECC are written to the DRAM as indicated at a block 240. Operations continue with the next request at block 222. Operations end as indicated at a block 224.

In FIG. 3, exemplary operations start with the MC 104 sending a read request as indicated at a block 302. Checking whether the read request is in the Alternate Memory Array (AMA) 402 is performed as indicated at a decision block 304. If the read request has a valid address in the AMA 402, then the data is obtained from the AMA as indicated at a block 306. Checking whether an error is detected on the read is performed as indicated at a decision block 308. When an error is detected on the read, and it is determined that the error is correctable and the Correctable Error (CE) does not exceed a preset threshold for CEs at a decision block 310, then the data is corrected with ECC and the AMA is updated as indicated at a block 311. When the error is an Uncorrectable error (UE) or a CE that exceeds the preset threshold for CEs, then the AMA locations are marked as unusable or corrupted as indicated at a block 312.

Otherwise if the read request is not in the AMA 402, then the data is obtained from the DRAM 108 as indicated at a block 314. Checking whether an error is detected on the read is performed as indicated at a decision block 316. When an error is not detected on the read at decision block 308 and at decision block 316, then operations continue with the next request as indicated at a block 318. The operations end as indicated at a block 320.

When an error is detected on the read from the DRAM, at decision block 316, it is determined if the error is correctable as indicated at a decision block 322. When a correctable error (CE) is identified at decision block 322, then checking for available spares is performed as indicated at a decision block 324. If spares are not available, the appropriate Memory Reliability Availability and Serviceability (Memory RAS) operations are performed as indicated at a block 326. When spares are available, then the corrected data with ECC is written into a new AMA location as indicated at a block 328. Then after the data and ECC is written at block 328 or after the RAS operations are performed at block 324, operations continue with the next request at block 318.

Figure 4:
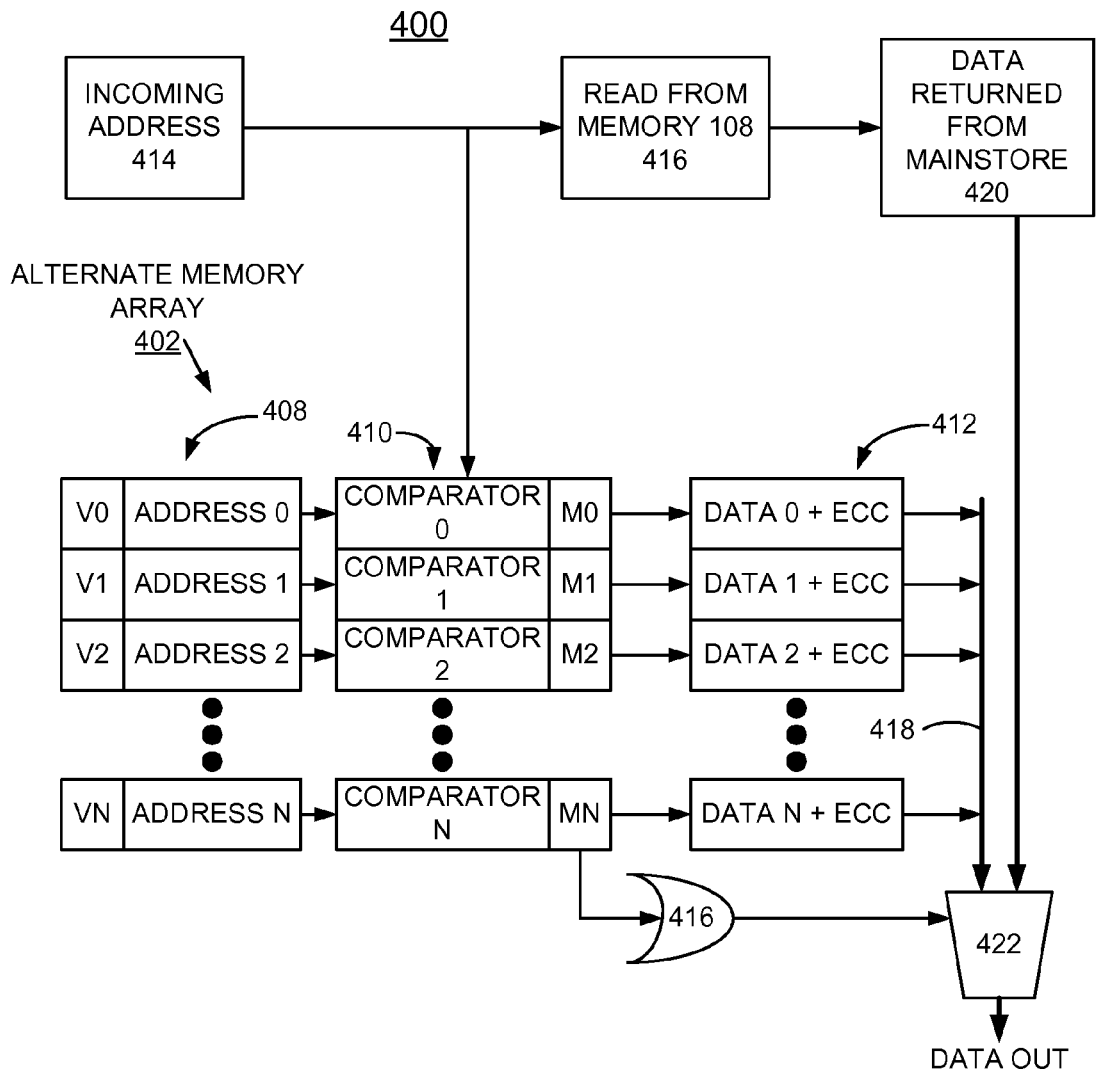
FIG. 4 is a more detailed diagram illustrating example on-memory controller alternate memory array hardware for read operations in the example system of FIG. 1 for implementing hardware assisted Dynamic Random Access Memory (DRAM) repair in accordance with the preferred embodiment.

Referring to FIG. 4, a read operation generally designated by the reference character 400 is illustrated with an Alternate Memory Array (AMA) 402 of the preferred embodiment. AMA 402 includes a plurality of addresses 0-N, 408 with a respective valid signal V0-VN, a plurality of comparators 0-N, 410 with a respective match signal M0-MN, and a plurality of data entries DATA 0+ECC-DATA N+ECC, 412. For example, to provide dedicated support to certain software operations, constraints on AMA 402 may be placed by providing a start and end addresses 408. The AMA 402 only populates its entries 412 with addresses 408 that are within the given range of the start and end addresses 408.

As shown in FIG. 4, a read request sent by the memory controller 104 includes an incoming address 414. The address 414 of read is compared against valid addresses 408 in AMA 402. The read command is sent unaltered to main memory 108 as indicated at a block 416. If this address matches any valid address in the AMA, the corresponding particular match signal of match signals M0-MN is set and the data 412 associated with that address is sent to an output bus 418. The data returned from memory as indicated at a block 420 and the data on the output bus 418 of the AMA 402 are input to a multiplexer 422 to determine which will be sent on the memory data bus. A select line applied to the multiplexer 422 includes an OR 416 of all match signals M0-MN from the AMA 402 where an address has been matched. Delivery of the data back to the processor incurs no extra latency from utilizing the AMA 402. If a match is found in the AMA 402, that data would return simultaneously with the data from mainstore 108 to preserve timings.

Figure 5:
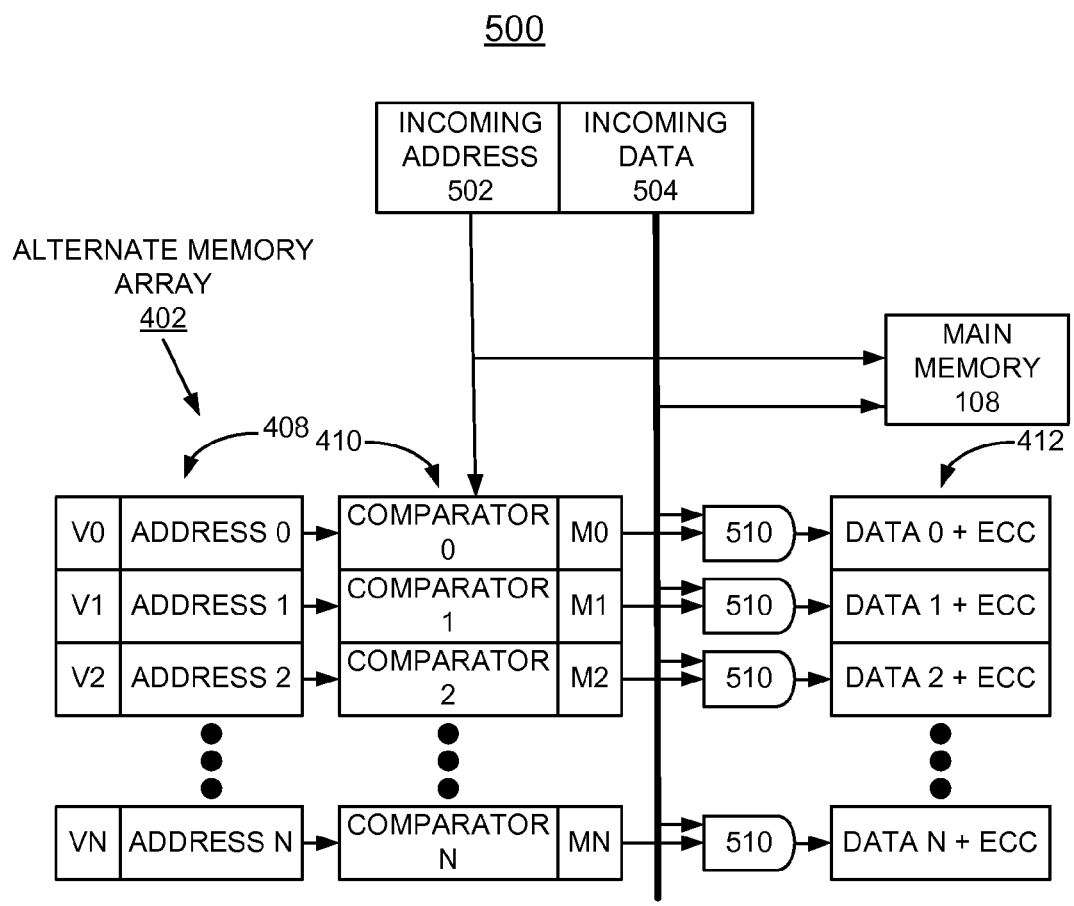
FIG. 5 is a more detailed diagram illustrating example on-memory controller alternate memory array hardware for write operations in the example system of FIG. 1 for implementing hardware assisted Dynamic Random Access Memory (DRAM) repair in accordance with the preferred embodiment.

Referring to FIG. 5, a write operation generally designated by the reference character 500 is illustrated with the AMA 402. A write request sent by the memory controller 104 includes an incoming address 502, and incoming data 504. The address 502 of the write is compared against valid addresses 408 in the AMA 402. Command and data also are sent unaltered to the main memory 108. If the incoming address 502 matches any valid address 408 in the AMA 402, the corresponding match signal M0-MN is set and the input data and ECC are written into the corresponding entry 412 of the AMA 402 via a respective gate 510. If an AMA address 408 does not match, the AMA 402 does nothing.

Figure 6:
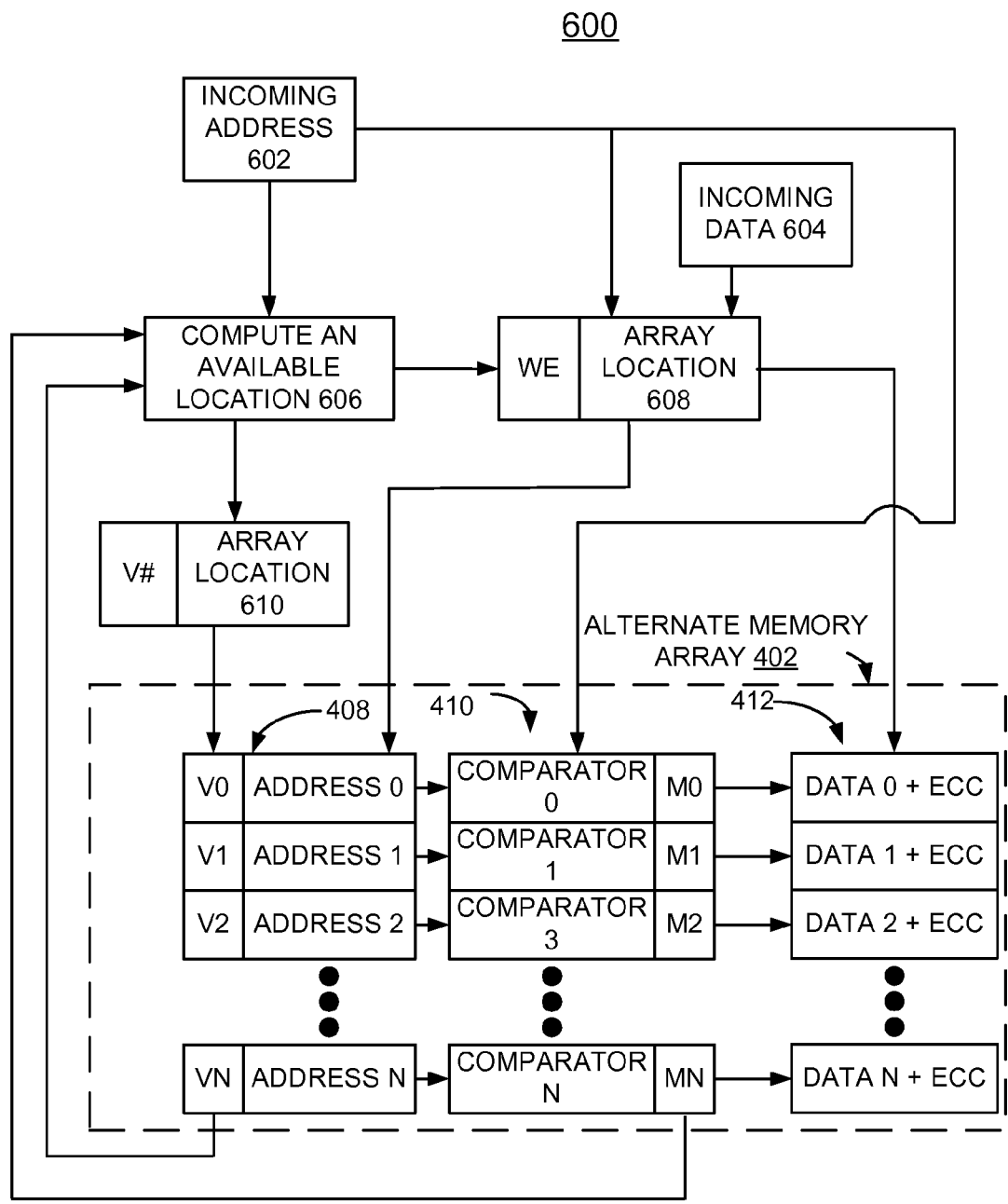
FIG. 6 is a more detailed diagram illustrating example read operations and populating the example alternate memory array hardware of FIGS. 4 and 5 in the example system of FIG. 1 for implementing hardware assisted Dynamic Random Access Memory (DRAM) repair in accordance with the preferred embodiment.

Referring to FIG. 6, populating AMA operation generally designated by the reference character 600 is illustrated with the AMA 402. For example, the populating AMA operation is responsive to a read request sent to main memory 108 that returns data with correctable error to utilize a spare entry in Alternate Memory Array (AMA) 402 with an incoming address 602 and incoming data 604. A next available entry in the AMA 402 is determined as indicated at a block 606 utilized both valid and match signals of address 408 and comparator 410 from the AMA 402, as well as an algorithm for optimization. An empty entry is returned, as well as an enable signal (WE) to allow writing to that entry as indicated at a block 608. If the address triggering the correction was already in the table match signal detected (V#) an invalidate signal will also be returned for that address to prevent further use of that entry as indicated at a block 610. The data and ECC are then written into the corresponding entry 412 to be used on the next read to this address.

It should be understood that to lower hardware costs, software algorithms optionally are used to populate the AMA 402 so that searching through the AMA does not require significant hardware. For example, techniques such as linked and doubly linked lists; sort and the like are used to populate the AMA. However, software algorithms may lead to loss of performance. When the AMA is full, an AMA full-bit is sent to the MC 104 indicating all entries 412 are used so the AMA 402 can be bypassed, if needed. Also, the AMA full-bit triggers an automatic clean-up of AMA 402. For example, in operation of system 100, with invalidation of data in main memory 108, those entries are deleted from the AMA 402 as well to free up space, such as with Page Guard software. If empty slots 412 are available in AMA 402, search through CE history of MC 104 to find addresses that are most likely to take a CE again and populate AMA with good data and ECC. High priority requests from MC are accepted to populate the AMA 402 with addresses that exceeded CE thresholds or are near exceeding CE thresholds. Priority schemes are implemented if all entries 412 of AMA 402 s are used up, and soft errors entries are cleaned up. Data coming back from main memory 108 are compared and after a set number of good data from main memory, the corresponding AMA entry 412 is deleted.

To maintain high RAS within the AMA 402 scrubbing of all the entries in the AMA must be performed periodically to invalidate and mark an entry unusable if a UE occurs or if a CE exceeds the threshold after fetching data from AMA. During IPL, the AMA 402 should also be initialized by performing read/write patterns and marking out bad locations. Periodically, entries within the AMA must be freed if associated addresses are made unavailable to the system via operations such as page guard.

Figure 7:
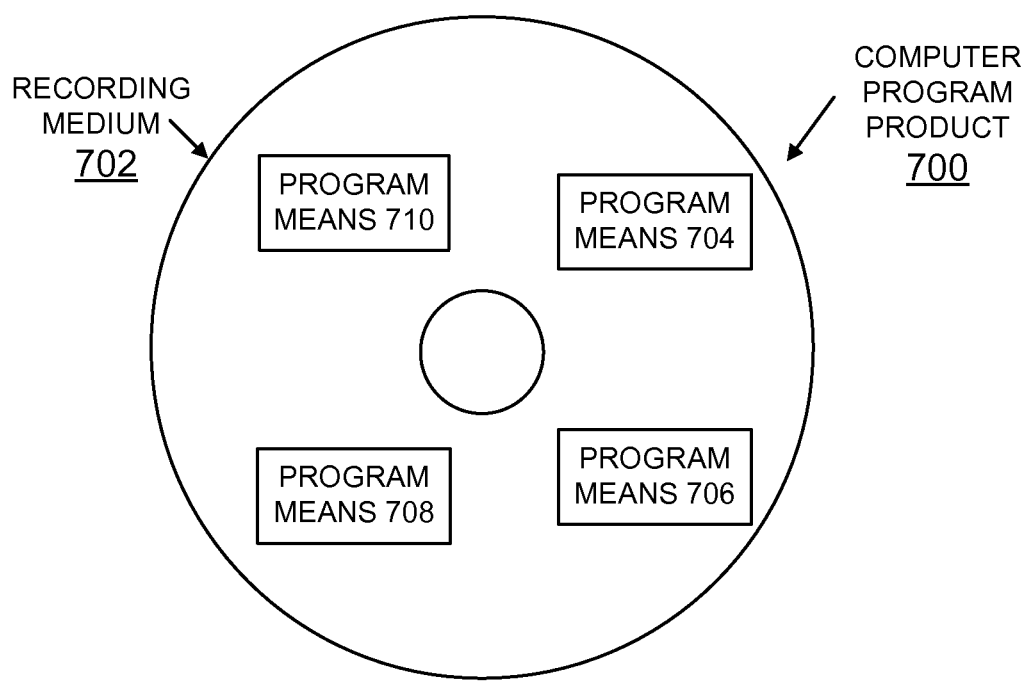
FIG. 7 is a block diagram illustrating a computer program product in accordance with the preferred embodiment.

Referring now to FIG. 7, an article of manufacture or a computer program product 700 of the invention is illustrated. The computer program product 700 is tangibly embodied on a non-transitory computer readable storage medium that includes a recording medium 702, such as, a floppy disk, a high capacity read only memory in the form of an optically read compact disk or CD-ROM, a tape, or another similar computer program product. Recording medium 702 stores program means 704, 706, 708, and 710 on the medium 702 for carrying out the methods for implementing hardware assisted Dynamic Random Access Memory (DRAM) repair of the preferred embodiment in the system 100 of FIG. 1.

A sequence of program instructions or a logical assembly of one or more interrelated modules defined by the recorded program means 704, 706, 708, and 710, direct the computer system 100 for implementing hardware assisted Dynamic Random Access Memory (DRAM) repair of the preferred embodiment.

While the present invention has been described with reference to the details of the embodiments of the invention shown in the drawing, these details are not intended to limit the scope of the invention as claimed in the appended claims.

What is claimed is:
1. A method for implementing hardware assisted Dynamic Random Access Memory (DRAM) repair in a computer system comprising:
selectively providing a data register used for the DRAM repair in a selected one of a plurality of DRAM modules of system DRAM, a memory controller, and a memory buffer coupled between the plurality of DRAM modules and the memory controller;
configuring said data register to map to any address,
responsive to a configured address being detected, performing writes to or reads from the data register for the configured address; performing writes to the data register includes receiving a write request, a write address, and write data, sending the write address and write data to the system DRAM, and comparing a write address with a valid address of the data register, and responsive to a matching valid address and write address, setting a match signal, and writing data and Error Correcting Code (ECC) to the data register; and
sending reads to both the DRAM modules of system DRAM and said data register and returning data from said data register responsive to a read address matching a valid address in said data register simultaneously with returning data from DRAM modules of system DRAM to preserve timings.

2. The method as recited in claim 1 wherein selectively providing said data register includes selectively providing an alternate memory array in the selected one of said plurality of DRAM modules of system DRAM, said memory controller, and said memory buffer.

3. The method as recited in claim 1 includes using said data register as a replacement of a failing address.

4. The method as recited in claim 3 includes writing to and reading from said data register directly.

5. The method as recited in claim 1 includes sending writes to both the DRAM modules of system DRAM and said data register.

6. The method as recited in claim 5 includes sending reads to the DRAM modules and said data register and returning data from the DRAM modules of system DRAM responsive to no error being detected.

7. The method as recited in claim 6 includes returning data from said data register responsive to an error being detected in data returned from the DRAM modules of system DRAM.

8. A system for implementing hardware assisted Dynamic Random Access Memory (DRAM) repair in a computer system comprising:
a main system memory including a plurality of DRAM modules;
a data register used for DRAM repair;
a memory controller coupled to said data register and the plurality of DRAM modules of system DRAM;
a memory buffer coupled between the plurality of DRAM modules and said memory controller;
said data register being selectively provided in a selected one of the plurality of DRAM modules, said memory controller, and said memory buffer;
a data register control;
said data register control configuring said data register to map to any address, and responsive to a configured address being detected, performing writes to or reads from the data register for the configured address;
said data register control performing writes to the data register includes receiving a write request, a write address, and write data, sending the write address and write data to the system DRAM, and comparing a write address with a valid address of the data register, and responsive to a matching valid address and write address, setting a match signal, and writing data and Error Correcting Code (ECC) to the data register; and
sending reads to both the DRAM modules of system DRAM and said data register and returning data from said data register responsive to a read address matching a valid address in said data register simultaneously with returning data from DRAM modules of system DRAM to preserve timings.

9. The system as recited in claim 8 wherein said data register control includes a data register control computer program product tangibly embodied on a non-transitory computer readable storage medium 10. The system as recited in claim 8 wherein said data register includes an alternate memory array in one of said selected one of the plurality of DRAM modules of system DRAM, said memory controller, and said memory buffer.

11. The system as recited in claim 8 includes said data register control using said data register as a replacement of a failing address.

12. The system as recited in claim 8 includes said data register control writing to and reading from said data register directly.

13. The system as recited in claim 8 includes said data register control using said data register as a backup address.

14. The system as recited in claim 8 wherein said data register control sending writes to both the system DRAM and said data register.

15. The system as recited in claim 14 includes said data register control sending reads to the DRAM modules of system DRAM and said data register and returning data from the respective DRAM modules responsive to no error being detected.

16. The system as recited in claim 15 includes said data register control returning data from said data register responsive to an error being detected in data returned from the DRAM modules of system DRAM.

* * * * *